US007834327B2

(12) United States Patent
Regan

(10) Patent No.: US 7,834,327 B2
(45) Date of Patent: Nov. 16, 2010

(54) SELF-BIASING ACTIVE LOAD CIRCUIT AND RELATED POWER SUPPLY FOR USE IN A CHARGED PARTICLE BEAM PROCESSING SYSTEM

(75) Inventor: Kenneth P. Regan, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 200 days.

(21) Appl. No.: 12/235,874

(22) Filed: Sep. 23, 2008

(65) Prior Publication Data

US 2010/0072393 A1 Mar. 25, 2010

(51) Int. Cl.

| | |
|---|---|
| ***H01J 37/30*** | (2006.01) |
| ***H01J 27/00*** | (2006.01) |
| ***H01J 7/30*** | (2006.01) |
| ***H02M 3/156*** | (2006.01) |

(52) U.S. Cl. .................. 250/423 R; 250/424; 250/427; 250/492.3; 118/723 CB; 315/111.01; 361/235

(58) Field of Classification Search ............ 250/423 R, 250/424, 427, 492.3; 118/723 CB; 315/111.01; 361/235
See application file for complete search history.

(56) References Cited

U.S. PATENT DOCUMENTS

| | | | | |
|---|---|---|---|---|
| 4,361,762 | A | 11/1982 | Douglas | |
| 4,886,971 | A | 12/1989 | Matsumura et al. | |
| 4,916,311 | A | 4/1990 | Fuzishita et al. | |
| 6,831,272 | B2 * | 12/2004 | Mack et al. | 250/287 |
| 7,060,989 | B2 | 6/2006 | Swenson et al. | |
| 7,173,252 | B2 | 2/2007 | Mack | |
| 7,345,856 | B2 * | 3/2008 | Regan | 361/2 |
| 2002/0130275 | A1 | 9/2002 | Mack et al. | |

FOREIGN PATENT DOCUMENTS

JP 62296357 A 12/1987

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

* cited by examiner

*Primary Examiner*—Nikita Wells
(74) *Attorney, Agent, or Firm*—Wood, Herron & Evans, LLP

(57) ABSTRACT

A load circuit device having a self-biasing active load circuit, and a related high voltage power supply configured to bias an optical element in a charged particle beam processing system, such as a gas cluster ion beam (GCIB) processing system. The high voltage power supply comprises a variable voltage supply having a load terminal at a load potential and a reference terminal at a reference potential, and a self-biasing active load circuit connected between the load terminal and the reference terminal, and configured to sustain a variable voltage drop between the load potential and the reference potential while maintaining a substantially constant current.

25 Claims, 6 Drawing Sheets

SELF-BIASING ACTIVE LOAD CIRCUIT AND RELATED POWER SUPPLY FOR USE IN A CHARGED PARTICLE BEAM PROCESSING SYSTEM

BACKGROUND OF THE INVENTION

1. Field of Invention

The invention relates to a self-biasing active load circuit and a related high voltage power supply and, in particular, to a high voltage power supply configured to bias an optical element in a charged particle beam processing system.

2. Description of Related Art

Gas-cluster ion beams (GCIB's) are used for many applications, including etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electron charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, and nitrous oxide, and mixtures of these gases.

Typically, a GCIB processing system comprises one or more optical elements to extract the cluster ions from the ionizer, accelerate the extracted cluster ions to a desired energy, and focus the energetic, extracted cluster ions to define the GCIB. The kinetic energy of the cluster ions in the GCIB may range from about 1000 electron volts (1 keV) to several tens of keV. For example, the GCIB may be accelerated to 1 to 100 keV.

Therefore, by design, one or more optical elements operate at a high voltage, and generally float above the desired voltage due to the relatively high impedance of most high voltage power supply outputs. In order to shunt excess current, a resistor load is disposed between the terminals of the high voltage power supply. However, when varying the desired voltage across a range of possible operating voltages, the power dissipation in the resistor load can become excessive, particularly at high voltages since the power dissipation scales as the square of the voltage (i.e., $P=V^2/R$, where P represents power dissipation, V represents voltage, and R represents resistance). This excessive power dissipation may be impractical at high voltages.

SUMMARY OF THE INVENTION

The invention relates to a high voltage power supply and, in particular, to a high voltage power supply configured to bias an optical element in a charged particle beam processing system. The invention further relates to a load circuit device that is configured to be used with a high voltage power supply to provide the biasing function.

According to one embodiment, a high voltage power supply is described. The high voltage power supply comprises a variable voltage supply having a load terminal at a load potential and a reference terminal at a reference potential, and a self-biasing active load circuit connected between the load terminal and the reference terminal, and configured to sustain a variable voltage drop between the load potential and the reference potential while maintaining a substantially constant current.

According to another embodiment, an optical element for use in a charged particle processing system is described. The optical element comprises: a high voltage electrode configured to be arranged along a beam line in a charged particle beam processing system; a variable voltage supply having a load terminal at a load potential and a reference terminal at a reference potential, and configured to couple the load potential to the high voltage electrode; and a self-biasing active load circuit connected between the load terminal and the reference terminal, and configured to sustain a variable voltage drop between the load potential and the reference potential while maintaining a substantially constant current.

According to yet another embodiment, a GCIB processing system configured to treat a substrate is described. The GCIB processing system comprises: a vacuum vessel; a gas cluster ion beam (GCIB) source disposed in the vacuum vessel and configured to produce a GCIB; and a substrate holder configured to support the substrate inside the vacuum vessel for treatment by the GCIB. The GCIB source comprises: a nozzle assembly comprising a gas source, a stagnation chamber and a nozzle, and configured to introduce under high pressure one or more gases through the nozzle to the vacuum vessel in order to produce a gas cluster beam, a gas skimmer positioned downstream from the nozzle assembly, and configured to reduce the number of energetic, smaller particles in the gas cluster beam, an ionizer positioned downstream from the gas skimmer, and configured to ionize the gas cluster beam to produce the GCIB, and beam optics positioned downstream from the ionizer, the beam optics comprising one or more optical elements configured to extract the GCIB, accelerate the GCIB, or focus the GCIB, or perform any combination of two or more thereof. At least one of the one or more optical elements comprises: a high voltage electrode configured to be arranged along a beam line in a GCIB processing system, a variable voltage supply having a load terminal at a load potential and a reference terminal at a reference potential, and configured to couple the load potential to the high voltage electrode, and a self-biasing active load circuit connected between the load terminal and the reference terminal, and configured to sustain a variable voltage drop between the load potential and the reference potential while maintaining a substantially constant current.

In accordance with still another embodiment, a load circuit device is described. The load circuit device comprises a self-biasing active load circuit configured to be connected between a first circuit node at a first potential and a second circuit node at a second potential, and configured to sustain a variable voltage drop between said first potential and said second potential while maintaining a substantially constant current.

DETAILED DESCRIPTION OF SEVERAL EMBODIMENTS

Figure 1:
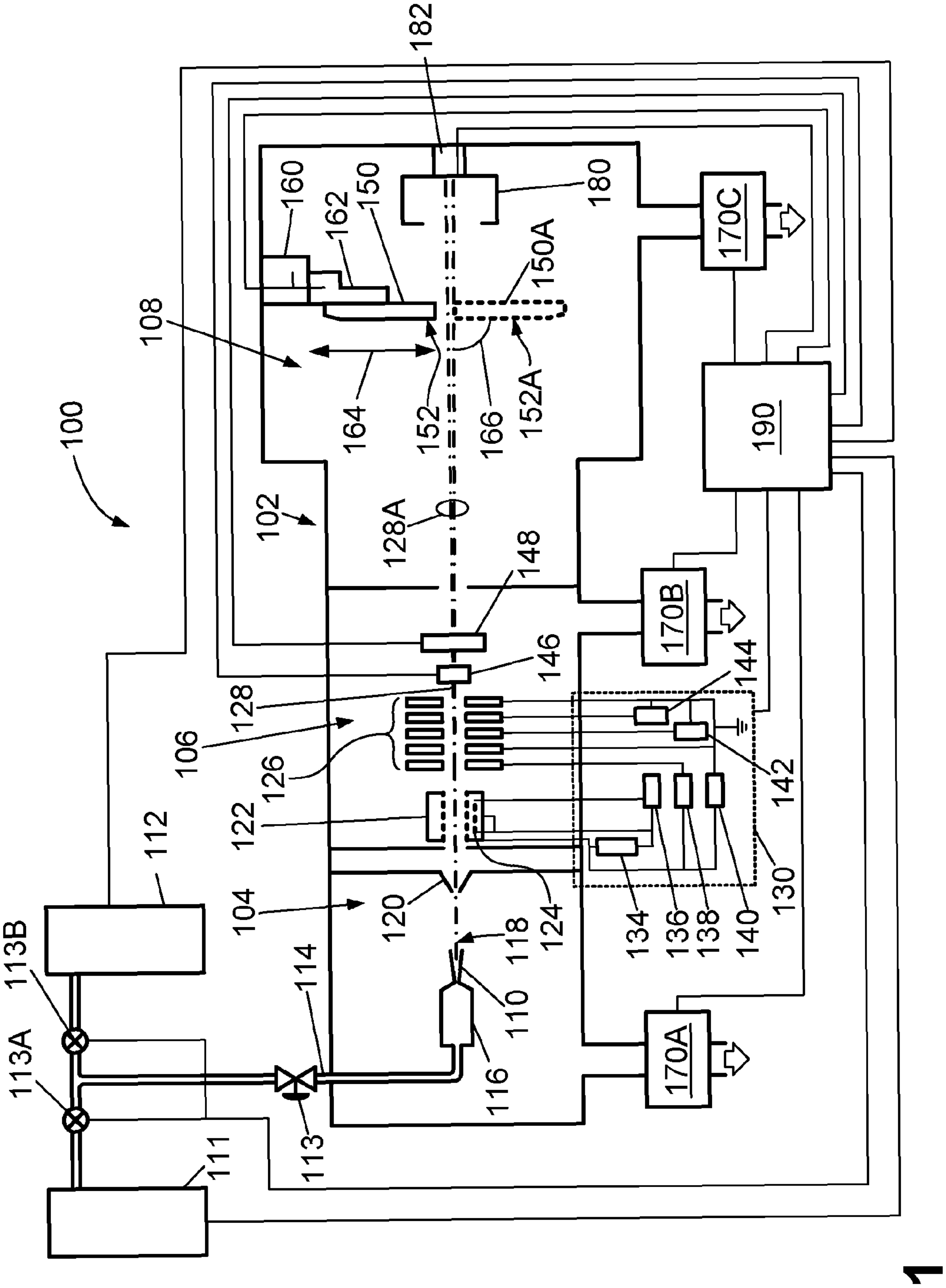
FIG. 1 is an illustration of a GCIB processing system.

A high voltage power supply configured to bias an optical element in a charged particle beam processing system, such as a gas cluster ion beam (GCIB) processing system, is disclosed in various embodiments. A load circuit device comprising a self-biasing active load circuit that can be added to a high voltage power supply to configure it to bias the optical element is also disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms “coupled” and “connected,” along with their derivatives, are used. It should be understood that these terms are not intended as synonyms for each other. Rather, in particular embodiments, “connected” may be used to indicate that two or more elements are in direct physical or electrical contact with each other while “coupled” may further mean that two or more elements are not in direct contact with each other, but yet still co-operate or interact with each other.

Reference throughout this specification to “one embodiment” or “an embodiment” means that a particular feature, structure, material, or characteristic described in connection with the embodiment is included in at least one embodiment of the invention, but do not denote that they are present in every embodiment. Thus, the appearances of the phrases “in one embodiment” or “in an embodiment” in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, there is a general need for electrically biasing one or more optical elements in a charged particle beam processing system, such as a GCIB processing system, to, among other things, extract, accelerate and focus the charged particle beam, or GCIB. However, conventional beam optics for biasing an optical element across a range of voltages suffer from high power dissipation due to the shunt of excess current through a resistor load. Accordingly, a high voltage power supply configured to bias an optical element in a charged particle beam processing system is described herein. A load circuit device comprising a self-biasing active load circuit that can be added to a high voltage power supply to configure it to bias the optical element is also disclosed herein. Although the load circuit device may be utilized with any charged particle beam processing system including but not limited to an ion implant equipment processing system, ion beam processing system, and GCIB processing system, the load circuit device is described in the context of a GCIB processing system.

Referring now to the drawings wherein like reference numerals designate corresponding parts throughout the several views, a GCIB processing system 100 for treating a substrate is depicted in FIG. 1 according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam can be formed in the second chamber (ionization/acceleration chamber 106) wherein the gas cluster beam is ionized and accelerated. Then, in the third chamber (processing chamber 108), the accelerated gas cluster ion beam may be utilized to treat substrate 152.

As shown in FIG. 1, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a film-forming gas composition, an etching gas composition, a dopant composition, etc. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 11 8 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam optics 130 are utilized to ionize, extract, accelerate, and focus the GCIB 128. The beam optics 130 includes a filament power supply 136 that provides voltage $V_F$ to heat the ionizer filament 124.

Additionally, the beam optics 130 includes a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam optics 130 further includes an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 1, the beam optics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam optics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam optics 130 can include lens power supplies 142,144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{acc}$. This typically requires fiber optic programming of control voltages for the ionizer power supply, but creates a simpler overall optics train. The invention described herein is useful regardless of the details of the ionizer and extraction lens biasing.

As will be described below, any one of the power supplies described above (e.g., extraction power supply 138, accelerator power supply 140, and/or lens power supplies 142,144) may comprise a high voltage power supply having a variable voltage supply, and a self-biasing active load circuit connected between a load terminal and a reference terminal for the variable voltage supply. The self-biasing active load circuit can be configured to sustain a variable voltage drop between the load potential and the reference potential while maintaining a substantially constant current.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 1 00 or less atoms or molecules or both. The beam filter may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
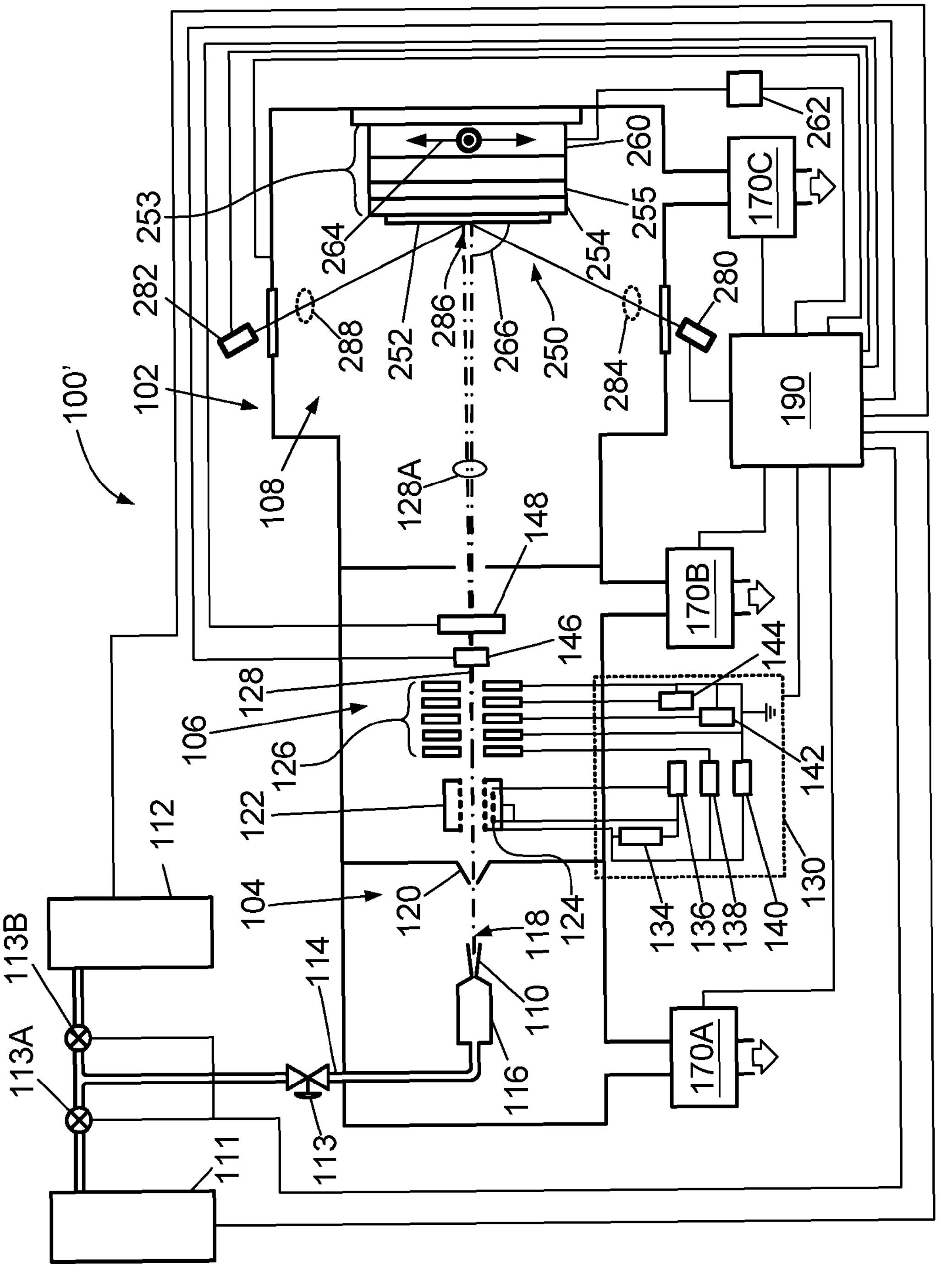
FIG. 2 is another illustration of a GCIB processing system.

In the embodiment shown in FIG. 2, the GCIB processing system 100' can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 1) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 3:
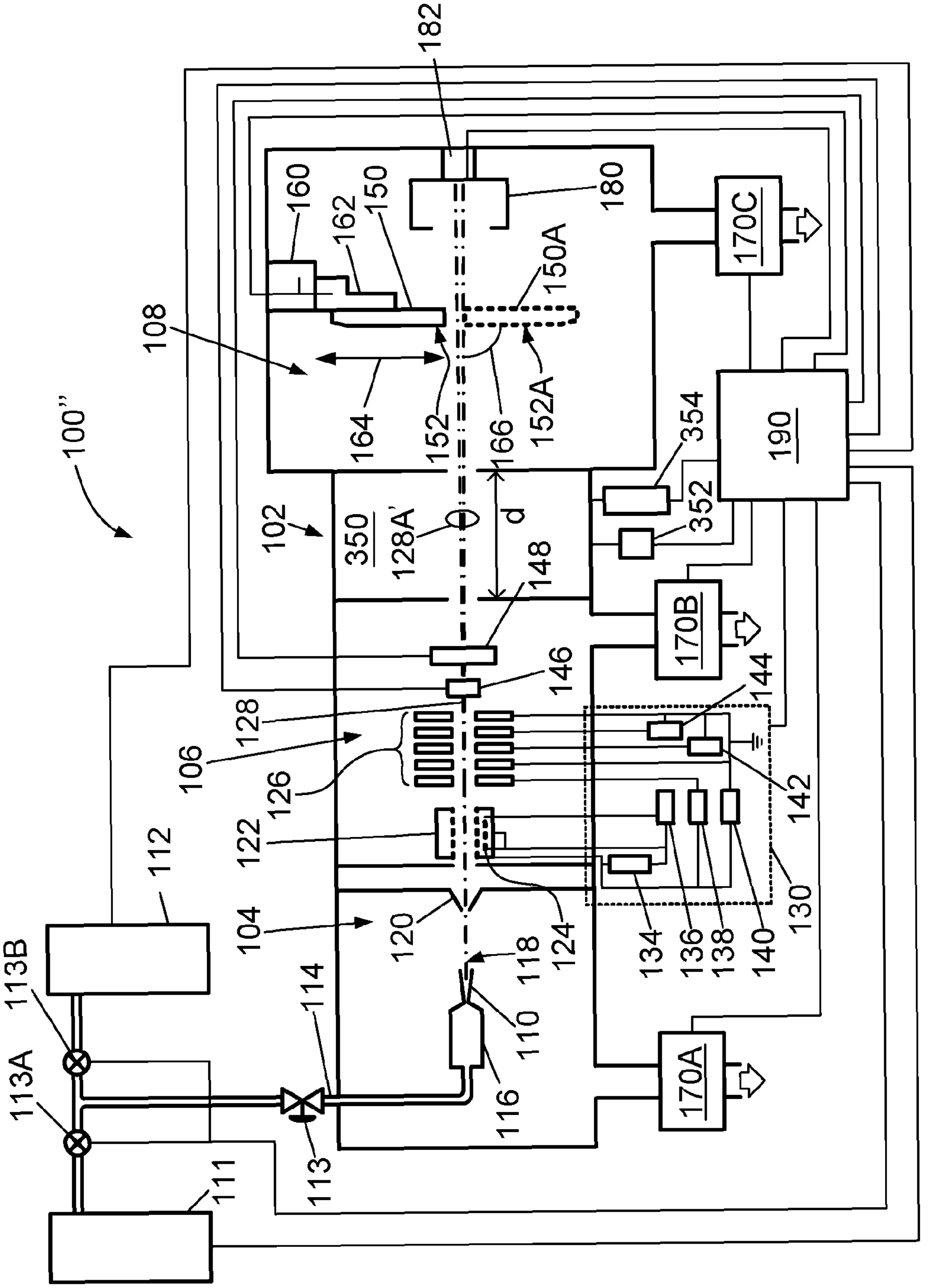
FIG. 3 is yet another illustration of a GCIB processing system.

In the embodiment shown in FIG. 3, the GCIB processing system 100" can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configure to measure the elevated pressure in the pressure cell chamber 350.

The pressure cell chamber 350 may be configured to modify the beam energy distribution of GCIB 128 to produce a modified process GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "METHOD AND APPARATUS FOR IMPROVED PROCESSING WITH A GAS-CLUSTER ION BEAM"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100") a as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam optics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152 (or 252).

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 4:
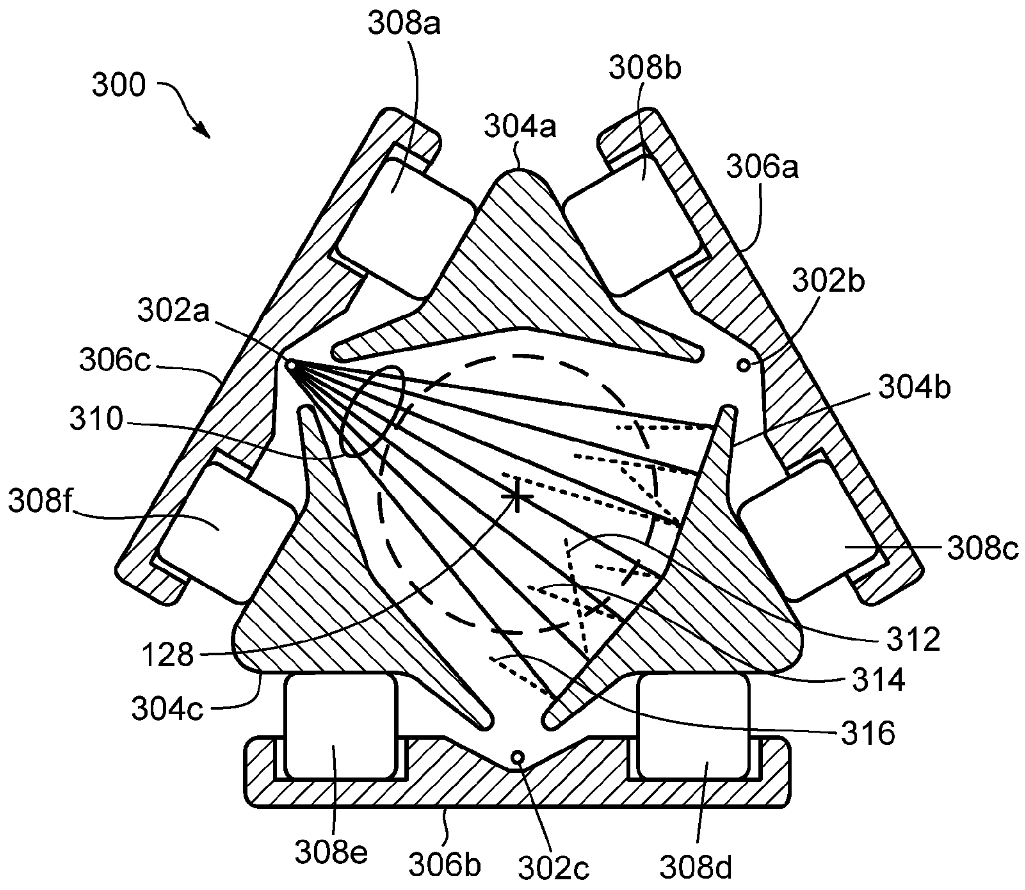
FIG. 4 is an illustration of an ionization source for a GCIB processing system.

Referring now to FIG. 4, a section 300 of a gas cluster ionizer (122, FIGS. 1, 2 and 3) for ionizing a gas cluster jet (gas cluster beam 118, FIGS. 1, 2 and 3) is shown. The section 300 is normal to the axis of GCIB 128. For typical gas cluster sizes (2000 to 15000 atoms), clusters leaving the skimmer aperture (120, FIGS. 1, 2 and 3) and entering an ionizer (122, FIGS. 1, 2 and 3) will travel with a kinetic energy of about 130 to 1000 electron volts (eV). At these low energies, any departure from space charge neutrality within the ionizer 122 will result in a rapid dispersion of the jet with a significant loss of beam current. FIG. 4 illustrates a self-neutralizing ionizer. As with other ionizers, gas clusters are ionized by electron impact. In this design, thermo-electrons (seven examples indicated by 310) are emitted from multiple linear thermionic filaments 302*a*, 302*b*, and 302*c* (typically tungsten) and are extracted and focused by the action of suitable electric fields provided by electron-repeller electrodes 306*a*, 306*b*, and 306*c* and beam-forming electrodes 304*a*, 304*b*, and 304*c*. Thermo-electrons 310 pass through the gas cluster jet and the jet axis and then strike the opposite beam-forming electrode 304*b* to produce low energy secondary electrons (312, 314, and 316 indicated for examples).

Though (for simplicity) not shown, linear thermionic filaments 302*b* and 302*c* also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304*a*, 304*b*, and 304*c* are biased positively with respect to linear thermionic filaments 302*a*, 302*b*, and 302*c* and electron-repeller electrodes 306*a*, 306*b*, and 306*c* are negatively biased with respect to linear thermionic filaments 302*a*, 302*b*, and 302*c*. Insulators 308*a*, 308*b*, 308*c*, 308*d*, 308*e*, and 308*f* electrically insulate and support electrodes 304*a*, 304*b*, 304*c*, 306*a*, 306*b*, and 306*c*. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled "IONIZER AND METHOD FOR GAS-CLUSTER ION-BEAM FORMATION"; the content of which is incorporated herein by reference in its entirety.

The gas cluster ionizer (122, FIGS. 1, 2 and 3) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figure 5:
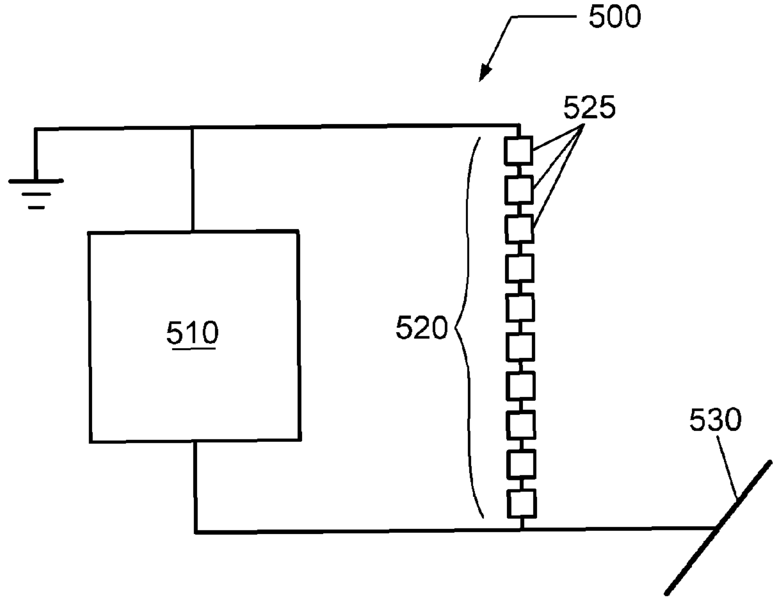
FIG. 5 provides a schematic illustration of a high voltage power supply according to an embodiment.

Referring now to FIG. 5, a high voltage power supply 500 is described according to an embodiment. The high voltage power supply 500 comprises a variable voltage supply 510, and a self-biasing active load circuit 520 configured to shunt excess current.

The variable voltage supply 510 comprises a load terminal at a load potential and a reference terminal at a reference potential, wherein the variable voltage supply 510 is configured to bias an optical element 530, such as a high voltage electrode, at the load potential. As illustrated in FIG. 5, the high voltage power supply 500 is configured to bias optical element 530 at a negative voltage relative to the reference potential. The self-biasing active load circuit 520 is connected between the load terminal and the reference terminal, and configured to sustain a variable voltage drop between the load potential and the reference potential while maintaining a substantially constant current. The self-biasing active load circuit 520 further comprises one or more active load elements 525, wherein each active load element 525 may be designed to sustain up to a maximum voltage drop. For example, as illustrated in FIG. 5, the self-biasing active load circuit 520 comprises an array of active load elements 525 connected in series.

In accordance with the invention, a load circuit device comprising a self-biasing active load circuit 520 may be added to an existing power supply to form a high voltage power supply 500, or the high voltage power supply 500 may be manufactured to initially include the self-biasing active load circuit 520. Thus, embodiments of the invention are directed to both a load circuit device itself, and a high voltage power supply that includes a self-biasing active load circuit. For the load circuit device itself, the self-biasing active load circuit is configured to be connected between a first circuit node at a first potential and a second circuit node at a second potential, and is configured to sustain a variable voltage drop between said first potential and said second potential while maintaining a substantially constant current.

Figure 6:
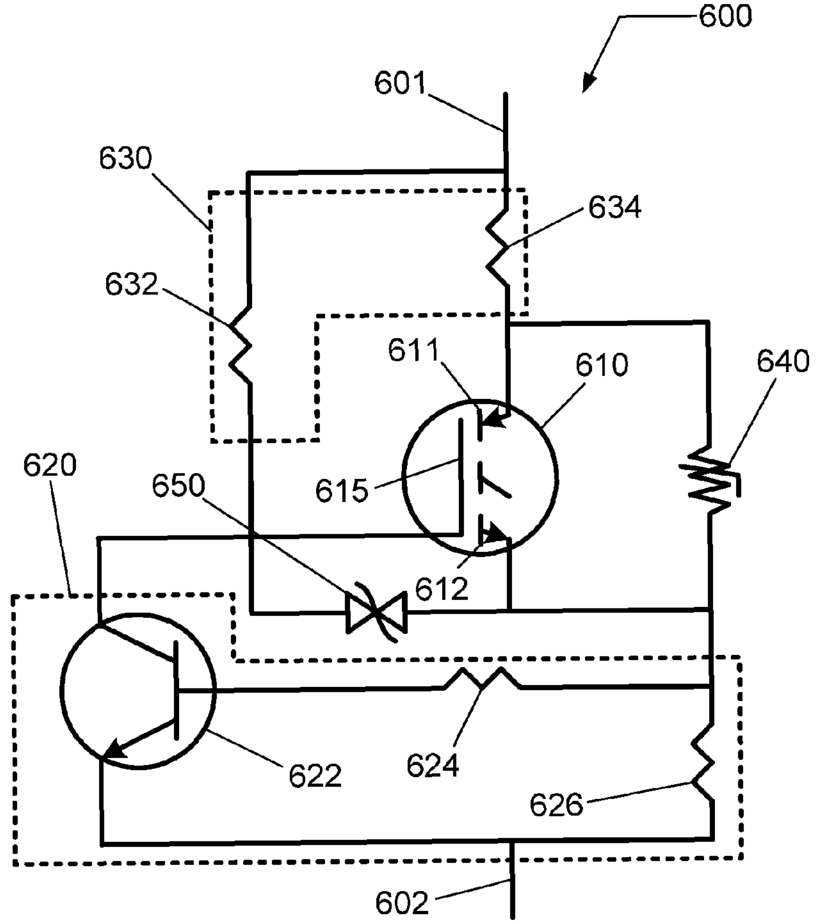
FIG. 6 provides a schematic illustration of an active load element in a self-biasing active load circuit according to another embodiment.

Referring now to FIG. 6, an electrical schematic is provided for an active load element 600 according to an embodiment. The active load element 600 comprises an insulated gate bipolar transistor 610 having a collector 611 coupled to a first terminal 601 of the active load element 600, an emitter 612 coupled to a second terminal 602 of the active load element 600, and a gate 615. The insulated gate bipolar transistor 610 may comprise a model IRG4PH50U insulated gate bipolar transistor commercially available from International Rectifier (El Segundo, Calif.).

Additionally, the active load element 600 comprises a current sensing circuit 620 coupled to the gate 615, and configured to sense a current through the insulated gate bipolar transistor 610 and to self-bias the gate 615 to a lower potential when the sensed current increases and self-bias the gate 615 to a higher potential when the sensed current decreases. The current sensing circuit 620 comprises a sensing device 622, and a first resistor 624 and a second resistor 626 to serve as a current divider. The sensing device 622 may comprise a model 2N3904 NPN general purpose amplifier commercially available from Fairchild Semiconductor (South Portland, Me.). The first resistor 624 may include a 10 kΩ resistor, and the second resistor 626 may comprise a 1.5 kΩ resistor.

Additionally yet, the active load element 600 comprises a start-up circuit element 630 connected between the first terminal 601 and both the collector 611 and the gate 615, and configured to initially charge the gate 615 once the variable voltage drop is applied across the active load circuit 600 at the first terminal 601 and the second terminal 602. The start-up circuit element 630 may include a first resistor 632 and a second resistor 634 to serve as a current divider. The first resistor 632 may include a 10 MΩ resistor, and the second resistor 634 may comprise a 100 kΩ resistor.

Furthermore, the active load element 600 comprises a varistor 640 connected in parallel with the insulated gate bipolar transistor 61 0, and configured to protect the insulated gate bipolar transistor 61 0 during initial transients of the active load circuit 600 once the variable voltage drop is applied across the first terminal 601 and the second terminal 602. The varistor 640 may comprise a LA Series varistor commercially available from Littelfuse (Des Plaines, Ill.).

Further yet, the active load element 600 comprises a reverse current diode 650 connected in parallel with the insulated gate bipolar transistor 610, and configured to protect the insulated gate bipolar transistor 610 in an event where a reverse current through the active load element 600 occurs.

Figure 7:
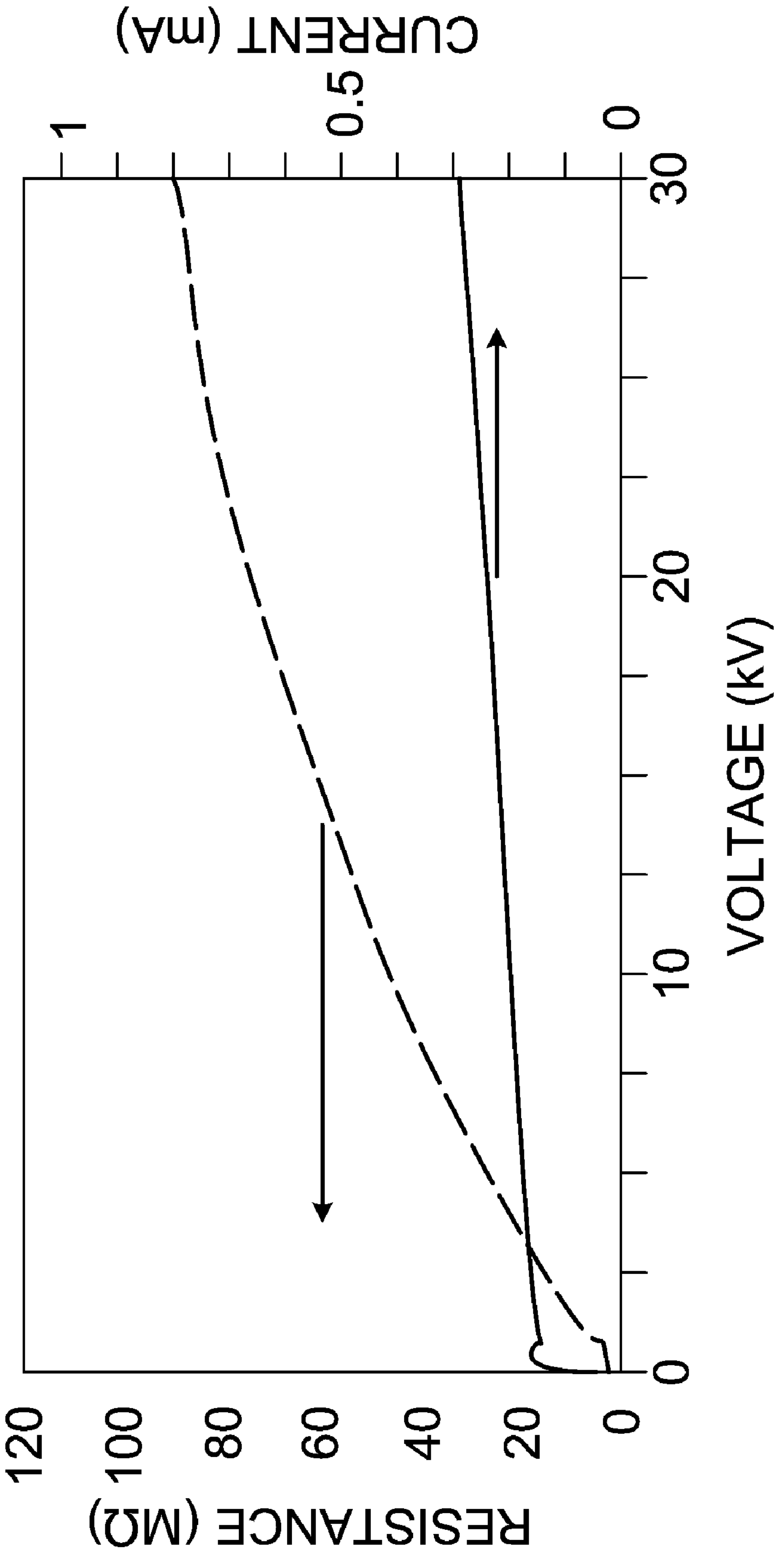
FIG. 7 provides exemplary data for resistance and current through a self-biasing active load circuit.

Referring now to FIG. 7, resistance (mega-Ohms, MΩ) and current (milli-Amps, mA) are provided for an array of active load elements (e.g., 525, 600) connected in series, wherein each active load element is designed according to the features described above to sustain a maximum voltage drop of about 1 kV. As shown in FIG. 7, the current is approximately constant across the 30 kV range of voltage.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A high voltage power supply used in a charged particle beam processing system, comprising:

a variable voltage supply having a load terminal at a load potential and a reference terminal at a reference potential; and a self-biasing active load circuit connected between said load terminal and said reference terminal, and configured to sustain a variable voltage drop between said load potential and said reference potential while maintaining a substantially constant current.

2. The high voltage power supply of claim 1, wherein said active load circuit comprises one or more active load elements connected in series, each of said one or more active load elements comprising:

an insulated gate bipolar transistor having a collector coupled to a first terminal of said active load element, an emitter coupled to a second terminal of said active load element, and a gate, and a current sensing circuit coupled to said gate, and configured to sense a current through said insulated gate bipolar transistor and to self-bias said gate to a lower potential when said sensed current increases and self-bias said gate to a higher potential when said sensed current decreases.

3. The high voltage power supply of claim 2, wherein each of said one or more active load elements further comprises:

a start-up circuit element connected between said first terminal and both of said collector and said gate, and configured to initially charge said gate once said variable voltage drop is applied across said active load circuit.

4. The high voltage power supply of claim 2, wherein each of said one or more active load elements further comprises:

a varistor connected in parallel with said insulated gate bipolar transistor, and configured to protect said insulated gate bipolar transistor during initial transients of said active load circuit once said variable voltage drop is applied.

5. The high voltage power supply of claim 2, wherein each of said one or more active load elements further comprises:

a reverse current diode connected in parallel with said insulated gate bipolar transistor, and configured to protect said insulated gate bipolar transistor in an event where a reverse current through said active load element occurs.

6. An optical element for use in a charged particle beam processing system, comprising:

a high voltage electrode configured to be arranged along a beam line in a charged particle beam processing system;

a variable voltage supply having a load terminal at a load potential and a reference terminal at a reference potential, and configured to couple said load potential to said high voltage electrode; and a self-biasing active load circuit connected between said load terminal and said reference terminal, and configured to sustain a variable voltage drop between said load potential and said reference potential while maintaining a substantially constant current.

7. The optical element of claim 6, wherein said active load circuit comprises one or more active load elements connected in series, each of said one or more active load elements comprising:

an insulated gate bipolar transistor having a collector coupled to a first terminal of said active load element, an emitter coupled to a second terminal of said active load element, and a gate, and a current sensing circuit coupled to said gate, and configured to sense a current through said insulated gate bipolar transistor and self-bias said gate to a lower potential when said sensed current increases and self-bias said gate to a higher potential when said sensed current decreases.

8. The optical element of claim 7, wherein each of said one or more active load elements further comprises:

a start-up circuit element connected between said first terminal and both of said collector and said gate, and configured to initially charge said gate once said variable voltage drop is applied across said active load circuit.

9. The optical element of claim 7, wherein each of said one or more active load elements further comprises:

a varistor connected in parallel with said insulated gate bipolar transistor, and configured to protect said insulated gate bipolar transistor during initial transients of said active load circuit once said variable voltage drop is applied.

10. The optical element of claim 7, wherein each of said one or more active load elements further comprises:

a reverse current diode connected in parallel with said insulated gate bipolar transistor, and configured to protect said insulated gate bipolar transistor in an event where a reverse current through said active load element occurs.

11. A GCIB processing system configured to treat a substrate, said GCIB processing system comprising:

a vacuum vessel;

a gas cluster ion beam (GCIB) source disposed in said vacuum vessel and configured to produce a GCIB, said GCIB source comprising:

a nozzle assembly comprising a gas source, a stagnation chamber and a nozzle, and configured to introduce under high pressure one or more gases through said nozzle to said vacuum vessel in order to produce a gas cluster beam, a gas skimmer positioned downstream from said nozzle assembly, and configured to reduce the number of energetic, smaller particles in said gas cluster beam, an ionizer positioned downstream from said gas skimmer, and configured to ionize said gas cluster beam to produce said GCIB, and beam optics positioned downstream from said ionizer, said beam optics comprising one or more optical elements configured to extract said GCIB, accelerate said GCIB, or focus said GCIB, or perform any combination of two or more thereof; and a substrate holder configured to support the substrate inside said vacuum vessel for treatment by said GCIB, wherein at least one of said one or more optical elements comprises:

a high voltage electrode configured to be arranged along a beam line in a GCIB processing system, a variable voltage supply having a load terminal at a load potential and a reference terminal at a reference potential, and configured to couple said load potential to said high voltage electrode, and a self-biasing active load circuit connected between said load terminal and said reference terminal, and configured to sustain a variable voltage drop between said load potential and said reference potential while maintaining a substantially constant current.

12. The GCIB processing system of claim 11, wherein said active load circuit comprises one or more active load elements connected in series, each of said one or more active load elements comprising:

an insulated gate bipolar transistor having a collector coupled to a first terminal of said active load element, an emitter coupled to a second terminal of said active load element, and a gate, and a current sensing circuit coupled to said gate, and configured to sense a current through said insulated gate bipolar transistor and self-bias said gate to a lower potential when said sensed current increases and self-bias said gate to a higher potential when said sensed current decreases.

13. The GCIB processing system of claim 12, wherein each of said one or more active load elements further comprises:

a start-up circuit element connected between said first terminal and both of said collector and said gate, and configured to initially charge said gate once said variable voltage drop is applied across said active load circuit.

14. The GCIB processing system of claim 12, wherein each of said one or more active load elements further comprises:

a varistor connected in parallel with said insulated gate bipolar transistor, and configured to protect said insulated gate bipolar transistor during initial transients of said active load circuit once said variable voltage drop is applied.

15. The GCIB processing system of claim 12, wherein each of said one or more active load elements further comprises:

a reverse current diode connected in parallel with said insulated gate bipolar transistor, and configured to protect said insulated gate bipolar transistor in an event where a reverse current through said active load element occurs.

16. The GCIB processing system of claim 11, further comprising:

a beam filter positioned downstream from said beam optics, and configured to substantially reduce the number of clusters having 100 or less atoms or molecules or both.

17. The GCIB processing system of claim 11, further comprising:

a pressure cell chamber positioned downstream from said beam optics, and configured to modify a beam energy distribution of said GCIB.

18. The GCIB processing system of claim 11, further comprising:

a scan actuator coupled to said substrate holder, and configured to translate said substrate holder to scan said substrate through said GCIB.

19. The GCIB processing system of claim 11, further comprising:

a metrology system coupled to said vacuum vessel, and configured to measure a surface property of said substrate.

20. The GCIB processing system of claim 11, further comprising:

a beam current sensor coupled to said vacuum vessel, and configured to measure a beam current for said GCIB.

21. A load circuit device for use in a voltage power supply for a charged particle beam processing system, comprising:

a self-biasing active load circuit configured to be connected between a first circuit node at a first potential and a second circuit node at a second potential, and configured to sustain a variable voltage drop between said first potential and said second potential while maintaining a substantially constant current.

22. The load circuit device of claim 21, wherein said active load circuit comprises one or more active load elements connected in series, each of said one or more active load elements comprising:

an insulated gate bipolar transistor having a collector coupled to a first terminal of said active load element, an emitter coupled to a second terminal of said active load element, and a gate, and a current sensing circuit coupled to said gate, and configured to sense a current through said insulated gate bipolar transistor and to self-bias said gate to a lower potential when said sensed current increases and self-bias said gate to a higher potential when said sensed current decreases.

23. The load circuit device of claim 22, wherein each of said one or more active load elements further comprises:

a start-up circuit element connected between said first terminal and both of said collector and said gate, and configured to initially charge said gate once said variable voltage drop is applied across said active load circuit.

24. The load circuit device of claim 22, wherein each of said one or more active load elements further comprises:

a varistor connected in parallel with said insulated gate bipolar transistor, and configured to protect said insulated gate bipolar transistor during initial transients of said active load circuit once said variable voltage drop is applied.

25. The load circuit device of claim 22, wherein each of said one or more active load elements further comprises:

a reverse current diode connected in parallel with said insulated gate bipolar transistor, and configured to protect said insulated gate bipolar transistor in an event where a reverse current through said active load element occurs.

* * * * *